(12) United States Patent
Subrahmanyam et al.

(10) Patent No.: US 6,654,654 B1
(45) Date of Patent: Nov. 25, 2003

(54) METHOD FOR CELL SELECTION DURING FEATURE GENERATION IN A COMPUTER-IMPLEMENTED SOLID MODELING SYSTEM

(75) Inventors: Somashekar Ramachandran Subrahmanyam, Farmington Hills, MI (US); Mahabaduge Janaka Kithsiri Jayasuriya, Brighton, MI (US)

(73) Assignee: Autodesk, Inc., San Rafael, CA (US)

( * ) Notice: Subject to any disclaimer, the term of this patent is extended or adjusted under 35 U.S.C. 154(b) by 0 days.

(21) Appl. No.: 09/561,377

(22) Filed: Apr. 27, 2000

(51) Int. Cl.[7] .............................................. G06F 19/00
(52) U.S. Cl. ........................................ 700/98; 345/420
(58) Field of Search ............................. 700/97, 98, 182, 700/86, 183; 345/418–420, 442, 441, 619, 629, 630; 703/1

(56) References Cited

U.S. PATENT DOCUMENTS

| | | | | |
|---|---|---|---|---|
| 4,618,924 A | * | 10/1986 | Hinds | 700/86 |
| 4,888,711 A | * | 12/1989 | Nguyen | 345/420 |
| 5,038,291 A | * | 8/1991 | Wang et al. | 700/98 |
| 5,497,451 A | * | 3/1996 | Holmes | 345/420 |

* cited by examiner

Primary Examiner—Leo Picard
Assistant Examiner—Steven R. Garland
(74) Attorney, Agent, or Firm—Gates & Cooper LLP

(57) ABSTRACT

A computer-implemented solid modeling system that generates Rib and Web features. One or more attribute values are set to indicate whether extended start and end segments for each chain of an open profile modeled in the system intersect with a part modeled in the system. The open profile and a sheet with attributes and their specified behaviors are inserted into the tool. The tool, which is generated from the open profile is united with the part to create a cellular topology graph structure, wherein the attributes get propagated to one or more cells of the cellular topology graph structure. The Rib or Web feature is then generated from one or more cells selected from the cellular topology graph structure based on the propagated attribute values.

51 Claims, 20 Drawing Sheets

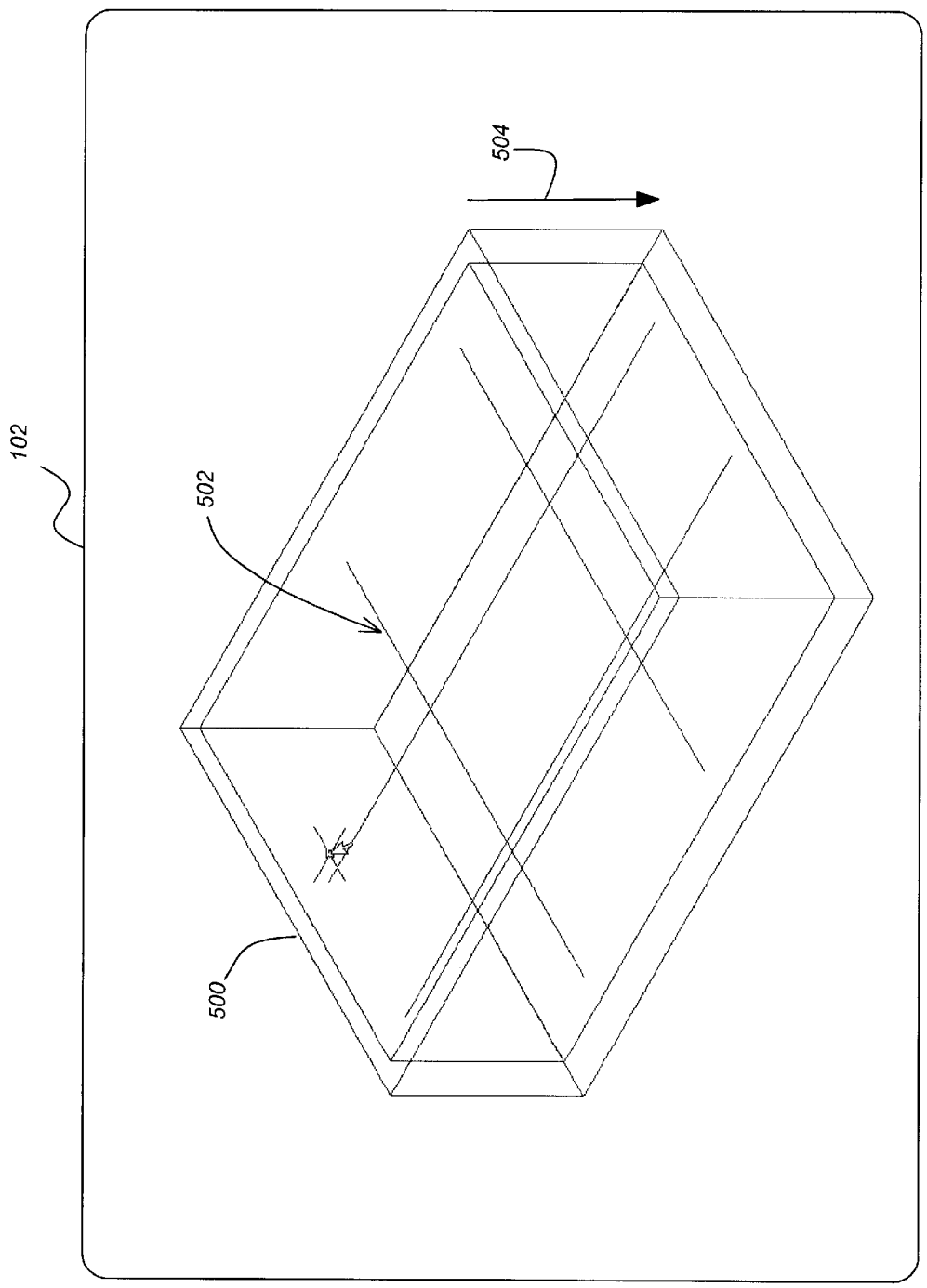

METHOD FOR CELL SELECTION DURING FEATURE GENERATION IN A COMPUTER-IMPLEMENTED SOLID MODELING SYSTEM

BACKGROUND OF THE INVENTION

1. Field of the Invention

The present invention relates generally to computer-assisted design (CAD) systems, and in particular, to a method for cell selection during feature generation in a solid modeling system.

2. Description of the Related Art

Over the last decade, designers have changed their fundamental approach to graphics design, moving from 2D drawing systems to 3D solid modeling systems. New software makes solid modeling technology available and affordable to virtually anyone.

Solid modeling is a technique that allows designers to create dimensionally accurate 3D solid models in 3D space represented within a computer, rather than traditional 2D drawings. 3D solid models include significantly more engineering data than 2D drawings, including the volume, bounding surfaces, and edges of a design.

With the graphics capabilities of today's computers, these 3D solid models may be viewed and manipulated on a monitor. In addition to providing better visualization, 3D solid models may be used to automatically produce 2D drawing views, and can be shared with manufacturing applications and the like.

Some 3D solid modeling systems generate parametric feature-based models. A parametric feature-based model is comprised of intelligent features, such as holes, fillets, chamfers etc. The geometry of the parametric feature-based model is defined by underlying mathematical relationships (i.e., parameters) rather than by simple unrelated dimensions, which makes them easier to modify. These systems preserve design intent and manage it after every change to the model.

Moreover, these features automatically change as the model is changed. The system computes any related changes to parts of the model that are dependent on a parameter, and automatically updates the entire model when the parameter is changed. For example, a through-hole will always completely go through a specified part, even if the part's dimensions are changed to be bigger than the hole.

Two parametric features found in solid modeling systems are Rib and Web features. However, such features are not easily generated in a solid modeling system. Typically, a Rib or Web feature is usually created by sketching a single open profile. With the Rib, the open profile is converted to a closed profile by extending the ends of the open profile to intersect with a part and extend well beyond it, and the closed profile is extruded by a specified thickness in a perpendicular direction to the plane of the profile to generate a tool. With the Web, the open profile is converted to a closed profile by offsetting the open profile by the specified thickness and extending to intersect with a part in the plane of the profile. The closed profile is extruded by a distance to go well beyond the part. The tool and the part are then unioned, subtracted, and/or intersected in a non-regularized manner. This is followed by selecting pieces to create either the Rib or Web feature.

In current systems, the specification of the open profile and thickness is often limited. For example, one needs to align the ends of the profile carefully with respect to a part. Besides, the thickness can be specified either in the plane of the profile or in a plane perpendicular to the profile. Moreover, the use of geometric comparisons or analyses, such as point-in-cell or curve-in-cell queries, to identify pieces to keep are computationally expensive and ambiguous, and are subject to errors arising from numerical approximations.

Consequently, there is a need in the art for a solid modeling system that more efficiently and effectively generates Rib or Web features.

SUMMARY OF THE INVENTION

To address the requirements described above, the present invention discloses a computer-implemented solid modeling system that generates Rib and Web features. One or more attribute values are set to indicate whether extended start and end segments for each chain of an open profile modeled in the system intersect with a part modeled in the system. The open profile and the sheet with attributes and specified behaviors are inserted into the tool. The tool, which is generated from the open profile, is united with the part to create a cellular topology graph structure, wherein the attribute values get propagated to one or more cells of the cellular topology graph structure. The Rib or Web feature is then generated from one or more cells selected from the cellular topology graph structure based on the propagated attribute values.

BRIEF DESCRIPTION OF THE DRAWINGS

Referring now to the drawings in which like reference numbers represent corresponding parts throughout:

FIGS. 5A and 5B are isometric views of an open profile, part, and Web feature in a solid modeling system;

DETAILED DESCRIPTION OF THE PREFERRED EMBODIMENTS

In the following description, reference is made to the accompanying drawings which form a part hereof, and which is shown, by way of illustration, an embodiment of the present invention. It is understood that other embodiments may be utilized and structural changes may be made without departing from the scope of the present invention.

Overview

The present invention is a parametric, feature-based solid modeling system that selects cells from a cellular topology graph structure in order to create Rib or Web features. The present invention provides a number of advantages. For example, attribute tracking is used, which is computationally inexpensive. The present invention also provides the user with maximum flexibility when sketching an open profile, so that undue attention to aligning the ends with respect to the part is not required. In addition, the present invention is robust, unambiguous and less error prone as compared with other methods.

Hardware and Software Environment

Figure 1:
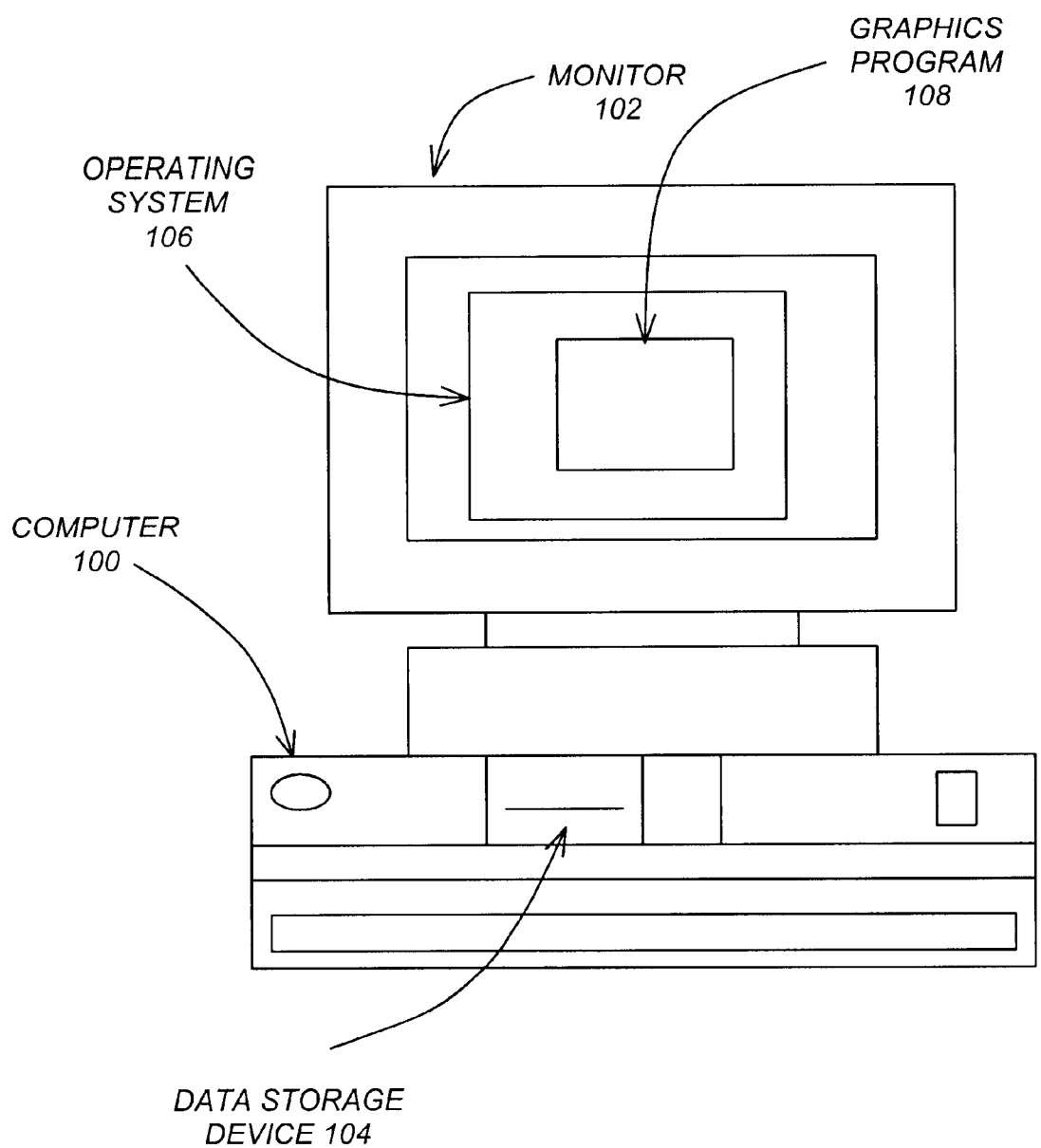
FIG. 1 is an exemplary hardware and software environment used to implement the preferred embodiment of the invention.

FIG. 1 is an exemplary hardware and software environment used to implement the preferred embodiment of the invention. The preferred embodiment of the present invention is typically implemented using a computer 100, which generally includes, inter alia, a monitor 102, data storage devices 104, and other devices. Those skilled in the art will recognize that any combination of the above components, or any number of different components, peripherals, and other devices, may be used with the computer 100.

The computer 100 usually operates under the control of an operating system 106, which is represented by a window displayed on the monitor 102. The preferred embodiment of the present invention is implemented by a computer-implemented graphics program 108 that operates under the control of the operating system 106, wherein the graphics program 108 is also represented by a window displayed on the monitor 102.

Generally, the operating system 106 and graphics program 108 comprise logic and/or data embodied in or readable from a device, media, or carrier, e.g., one or more fixed and/or removable data storage devices 104 connected directly or indirectly to the computer 100, one or more remote devices coupled to the computer 100 via data communications devices, etc.

Those skilled in the art will recognize that the exemplary environment illustrated in FIG. 1 is not intended to limit the present invention. Indeed, those skilled in the art will recognize that other alternative environments may be used without departing from the scope of the present invention.

Computer-Implemented Graphics Program

Figure 2:
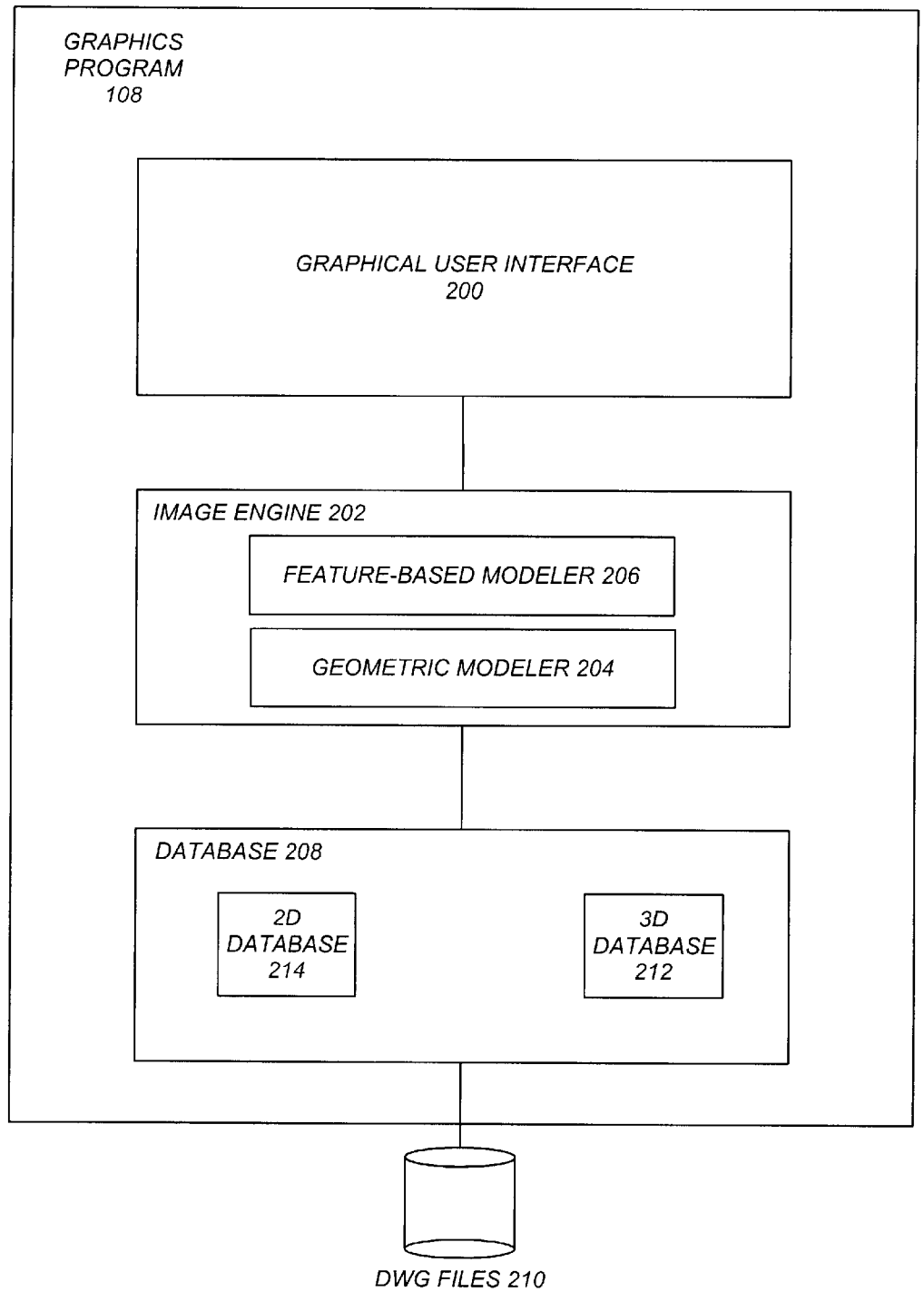
FIG. 2 is a block diagram that illustrates the components of the graphics program according to the preferred embodiment of the present invention.

FIG. 2 is a block diagram that illustrates the components of the graphics program 108 according to the preferred embodiment of the present invention. There are three main components to the graphics program 108, including: a Graphical User Interface (GUI) 200, an Image Engine (IME) 202 including a Geometric Modeler (GM) 204 and Feature-Based Modeler (FM) 206, and a database (DB) 208 for storing objects in Drawing (DWG) files 210.

The Graphical User Interface 200 displays information to the user and provides the functionality for the user's interaction with the graphics program 108.

The Image Engine 202 processes the Database 208 or DWG files 210 and delivers the resulting graphics to an output device. In the preferred embodiment, the Image Engine 202 provides a complete application programming interface (API) that allows other computer programs to interface to the graphics program 108 as needed.

The Geometric Modeler 204 primarily creates geometry and topology for models. The Feature-Based Modeler 206, which interacts with the Geometric Modeler 204, is a parametric feature-based solid modeler that integrates 2D and 3D mechanical design tools, including parametric assembly modeling, surface modeling, 2D design, and associative drafting. The Feature-Based Modeler 206 provides powerful solid-, surface-, and assembly-modeling functionality.

The Database 208 is comprised of two separate types of databases: (1) a 3D database 212 known as the "world space" that stores 3D information; and (2) one or more 2D databases 214 known as the "virtual spaces" or "view ports" that stores 2D information derived from the 3D information. The 3D database 212 captures the design intent and behavior of a component in a model.

Object Structure

Figure 3:
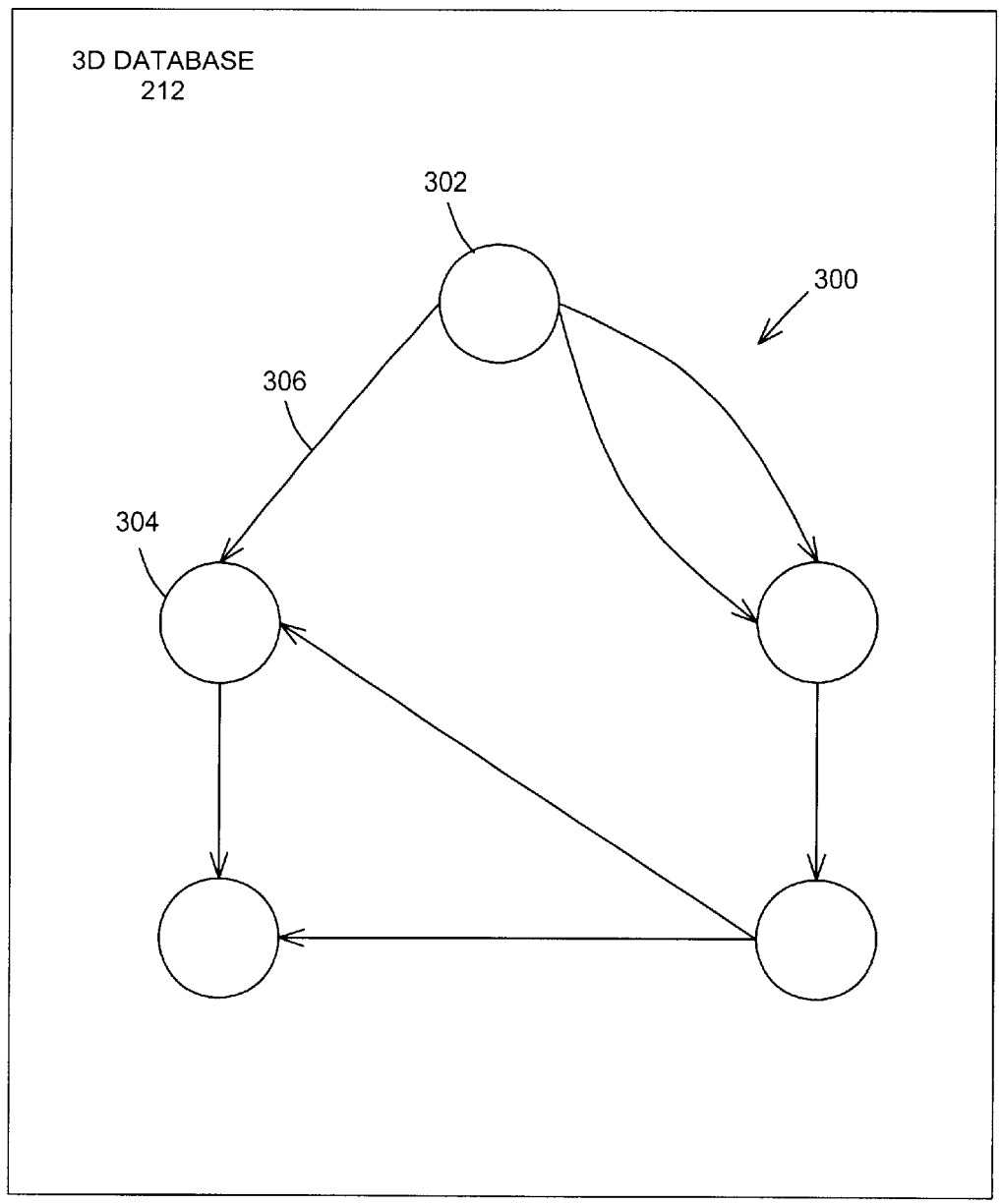
FIG. 3 is a block diagram that illustrates an object structure maintained by the 3D database according to the preferred embodiment of the present invention.

FIG. 3 is a block diagram that illustrates an object structure 300 maintained by the 3D database 212 according to the preferred embodiment of the present invention. Each object structure 300 includes a header node 302 and usually includes one or more nodes 304 connected by zero or more edges 306. There may be any number of different object structures 300 maintained by the 3D database 212. Moreover, a node 304 may be a member of multiple structures 300 in the 3D database 212.

Operation of the Preferred Embodiment

Figure 4A:
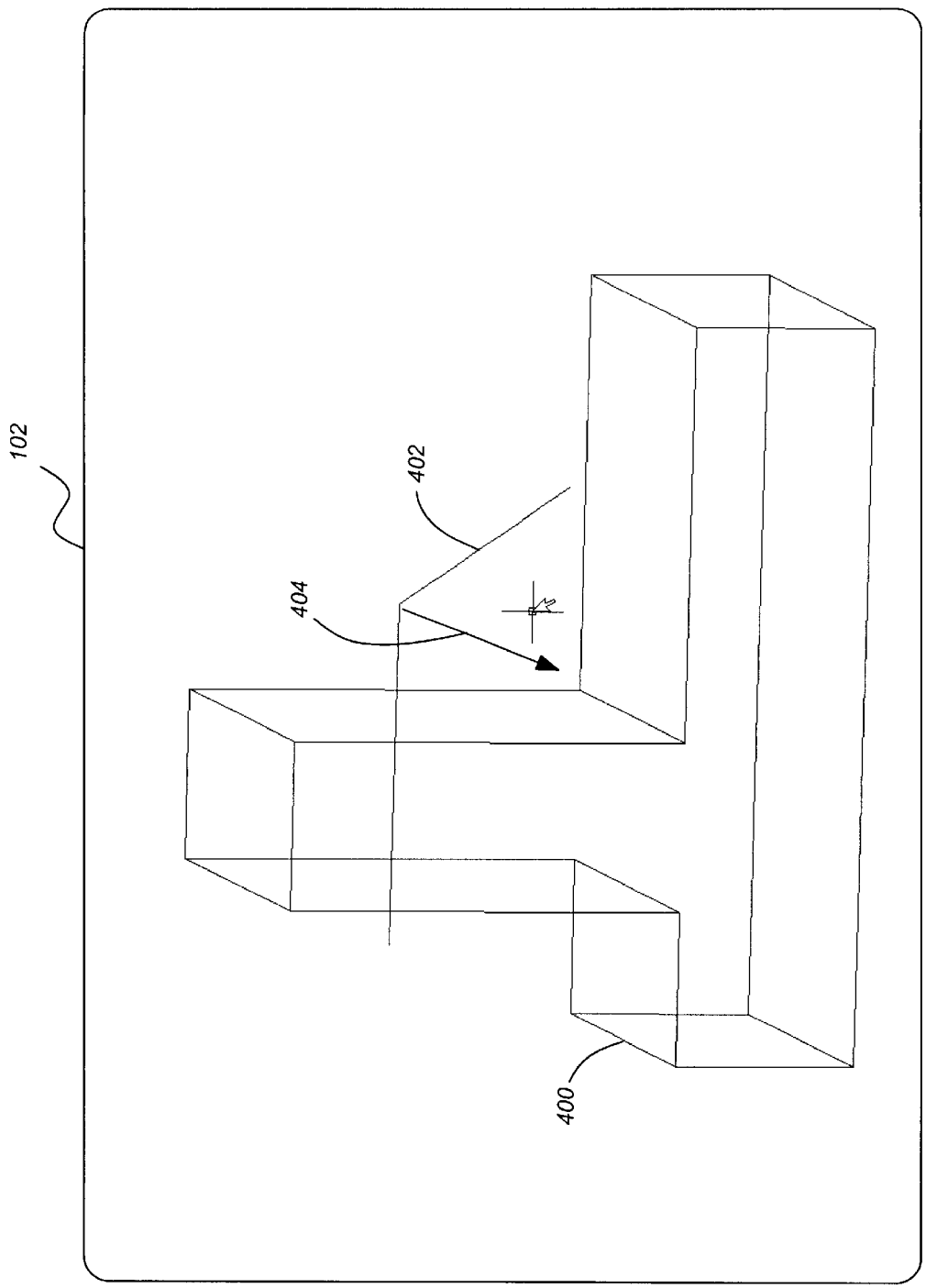
FIGS. 4A and 4B are isometric views of an open profile, part, and Rib feature in a solid modeling system.
Figure 4B:
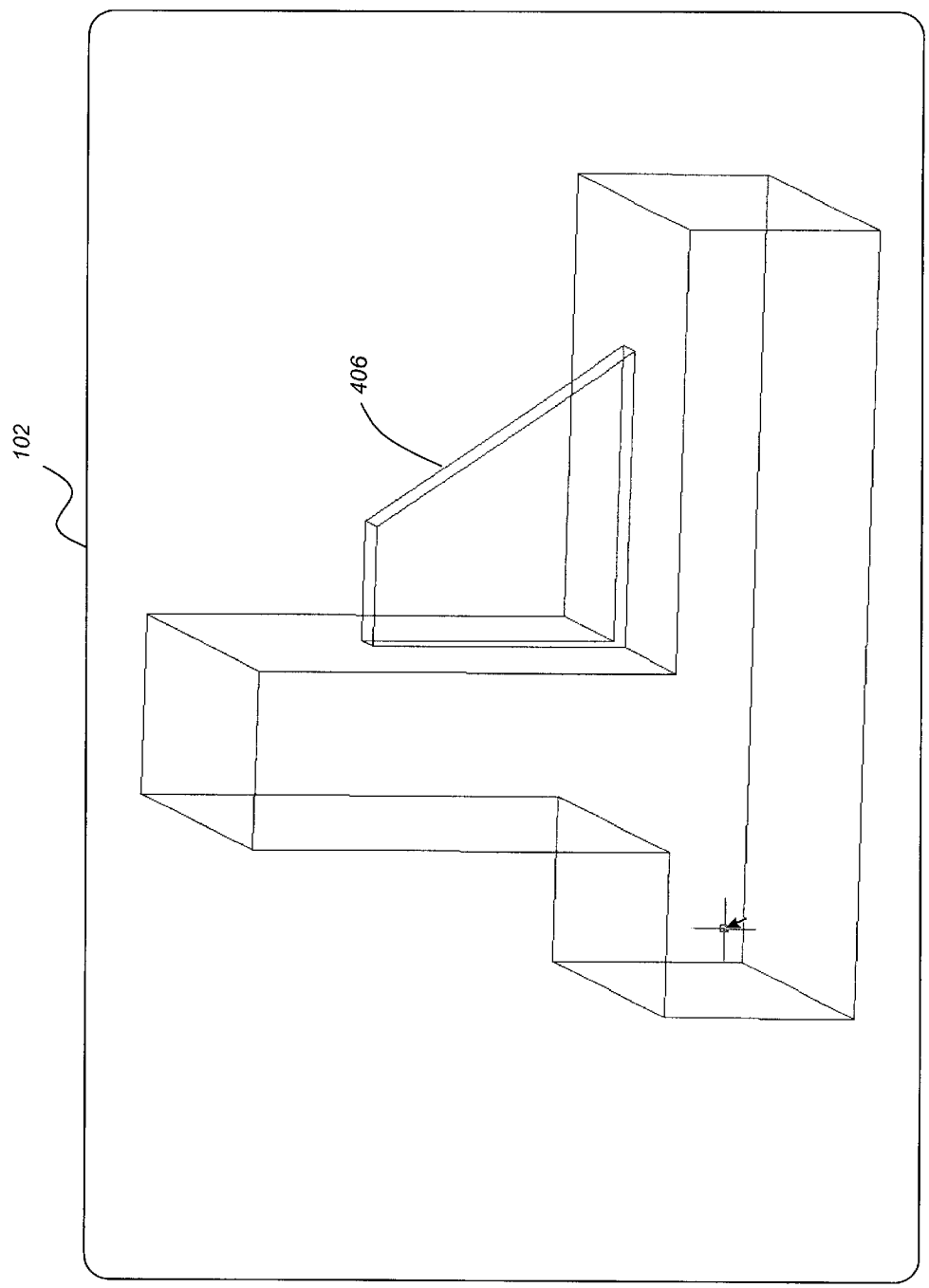

A Rib feature is usually created by using a single open profile with no chains (it can have only two open ends), fill direction and thickness specification. FIG. 4A shows a part 400, open profile (1 profile with 0 chains) 402, and fill direction (arrow) 404 for a Rib. The open profile 402 is converted to a closed profile by extending the ends of the open profile 402 tangentially, well beyond the bounding box of the part 400, and then closing the profile 402. The closed profile is extruded to a desired thickness in a perpendicular direction to the plane of the profile to create the tool. The tool and the part 400 are then unioned to create the Rib feature 406 shown in FIG. 4B.

Figure 5B:
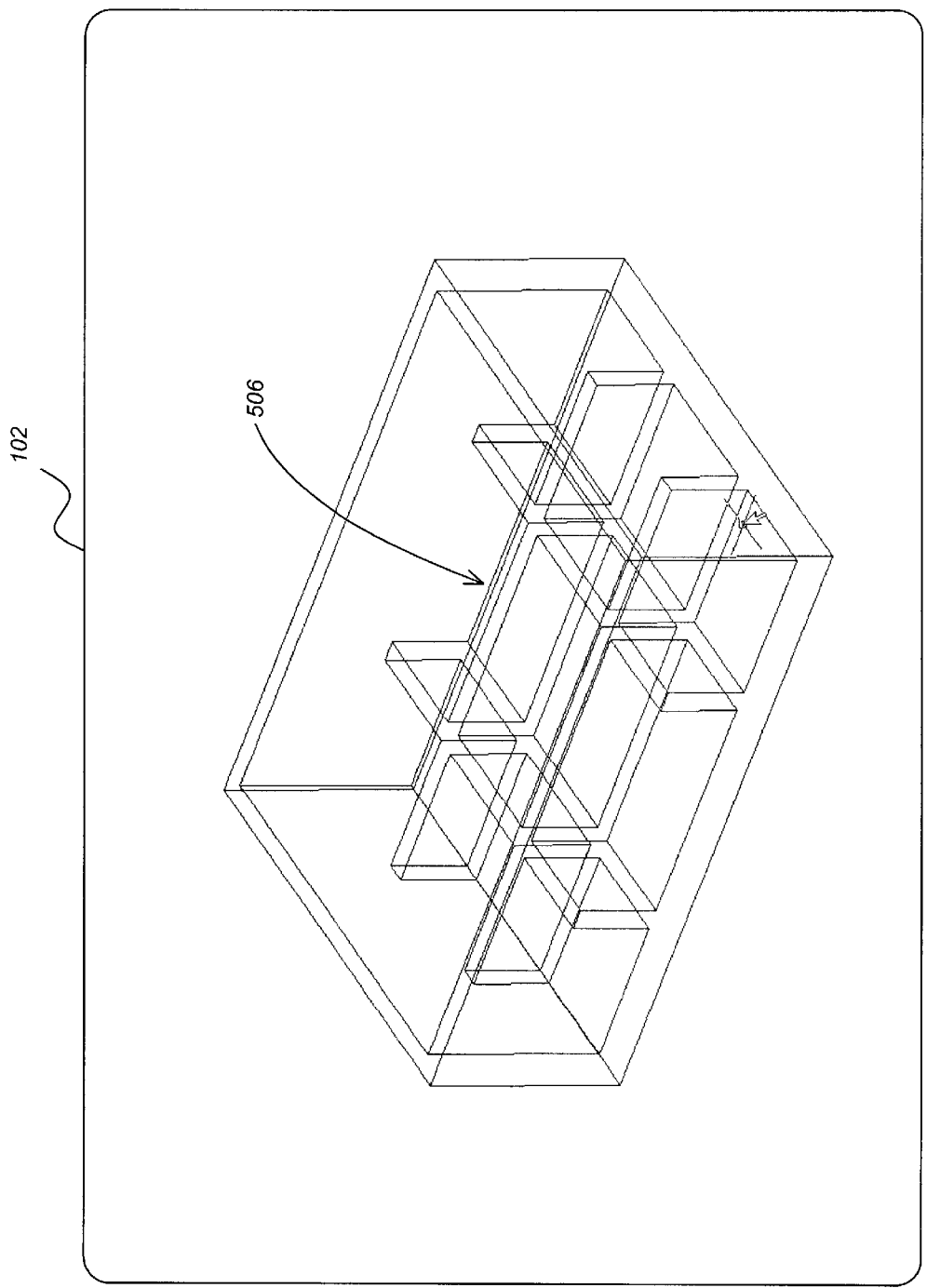

Similarly, a Web feature is usually created by a single open profile with one or more chains (2 or more open ends), fill direction, draft angle and thickness specification. FIG. 5A shows the part 500, open profile (1 profile with 4 chains) 502, and fill direction (arrow) 504. The open profile 502 is offset by a thickness value in both directions in the plane of the open profile 502, extended beyond the bounding box of the part 500, and then the ends are closed to create a closed profile. The closed profile is extruded in a direction perpendicular to the plane of the closed profile by a safe distance, well beyond the part 500, to create the tool. The tool and the part 500 are used to create the Web feature 506 shown in FIG. 5B. While the Rib feature 406 is always united with the part 400, the Web feature 506 can be unioned, subtracted or intersected with the part 500.

In the present invention, the part and the tool are intersected in a non-regularized unite operation using the Geometric Modeler 204. After this operation, the Geometric Modeler 204 creates a cellular topology graphical structure for the part and tool. The cellular topology graphical structure may be comprised of tool-type cells, part-type cells, and common-type cells (i.e., cells that are both tool-type and part-type cells). The Feature-Based Modeler 206 then uses a robust and inexpensive method to decide which, if any, tool-type, part-type, or common-type cells should be retained to obtain the desired results, to generate the Rib or the Web feature.

In existing techniques, one (brute-force) approach is to perform point-in-cell or curve-in-cell queries, which amounts to geometric comparisons. This technique involves checking whether the edges/curves and vertices/points of the open profile are contained in each cell of the cellular topology graphical structure. However, geometric comparisons are not only expensive, but also prone to numerical approximation errors, which can create ambiguity as to whether a cell should be selected or discarded.

Another approach, which avoids geometric comparisons, is to track attributes from the open profile to the closed profile, and then finally to the cells of the cellular topology graphical structure. However, it becomes extremely hard and complicated to select cells based on those attributes, especially when there are straight line segments in the open profile extending to straight lines in the closed profile. In such situations, the end vertices of the open profile are merged out (or disappear) in the resulting segments of the closed profile.

The approach used by the present invention involves attribute propagation, but in a much simpler and robust manner. Specifically, the approach comprises two steps: (1) open profile and sheet insertion in tool; and (2) cell selection.

In the first step, the Feature-Based Modeler 206 determines whether start and end segments for each chain in the open profile, when extended tangentially, will intersect with the part. In order to find this, a ray is constructed tangential to the start and/or end segments. These rays are flipped if necessary, so that they always emanate in the extension direction.

If a ray intersects the part, then this information is captured in the form of a "ray_hit" attribute associated with the vertex connecting the ray with the start or end segment. A "ray_hit" attribute value of 1 indicates that an intersection did occur, while a "ray_hit" attribute value of 0 indicates otherwise.

A sheet is constructed using the open profile and all its faces are tagged with a "profile" attribute. For the Rib, the open profile is extruded by the specified thickness perpendicular to the plane of the profile to create the sheet. For the Web, the open profile is offset by the specified thickness in the plane of the profile to create the sheet. The Feature-Based Modeler 206 closes the open profile to form a closed profile, which is then used by the Geometric Modeler 204 to create the tool. As a result, the open profile and the sheet are united in a non-regularized manner with the tool.

Thereafter, for every change made to the tool, the two attributes are propagated by the Geometric Modeler 204 based on the following specified behaviors. If an existing entity is split into a new entity, these attributes are copied to the new entity. If an existing entity is merged with another entity, the Geometric Modeler 204 keeps all the attributes. If an entity is transformed, then no action is taken.

In the second step, the part and the tool (with the inserted open profile and sheet) are united in a non-regularized manner using the Geometric Modeler 204 to generate the cellular topology graphical structure. In a first pass of the second step, all tool-type cells are collected into a list. In a second pass of the second step, only valid cells are selected from the tool-type cells. A cell is considered valid if one or more of its faces includes a "profile" attribute and the vertices connecting the start and end segments of edges either do not include a "ray_hit" attribute or have a "ray_hit" attribute with a value of 1. The presence of "profile" attributes in cells indicates that they were generated as a result of the user-sketched open profile, and thus the user is interested in these cells. The absence of "profile" attributes in cells indicates that they were generated due to the closing of the open profile, and thus the user is not interested in these cells.

In generating the Rib feature, all part-type and valid tool-type cells are kept and the other cells are discarded. In generating the Web feature, the part-type cells are kept and the other cells are discarded, based on the type of operation being performed. For a union operation, all the part-type cells and valid tool-type cells are kept. For a cut operation, all the part-type cells, except those that are also valid tool-type cells, are kept. For an intersect operation, only the valid tool-type cells that are also part-type cells, i.e., common-type cells, are kept.

Figure 6A:
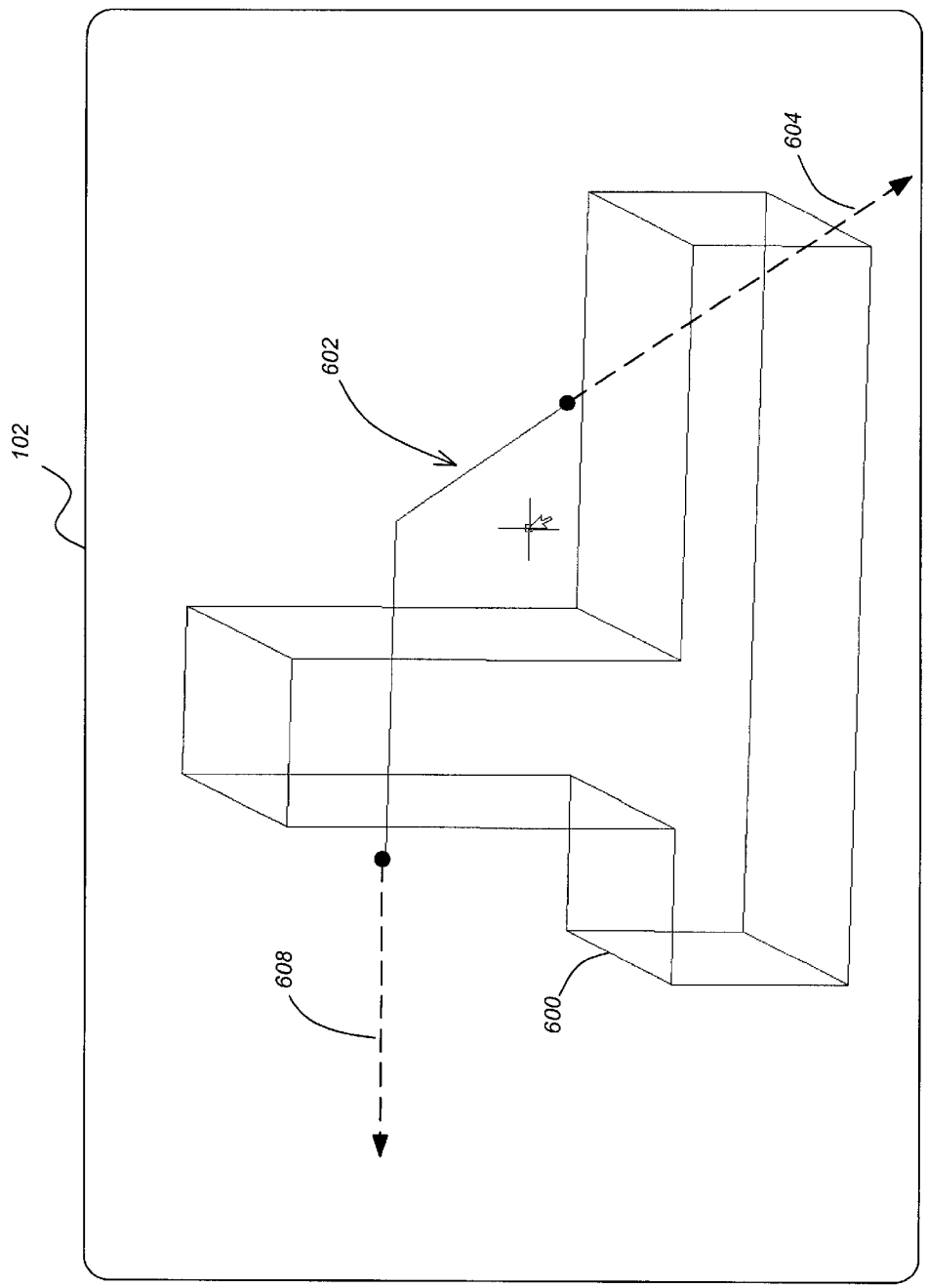
FIGS. 6A, 6B, 6C and 6D illustrate the generation of a Rib feature from a cellular topology graph structure according to the preferred embodiment of the present invention.
Figure 6B:
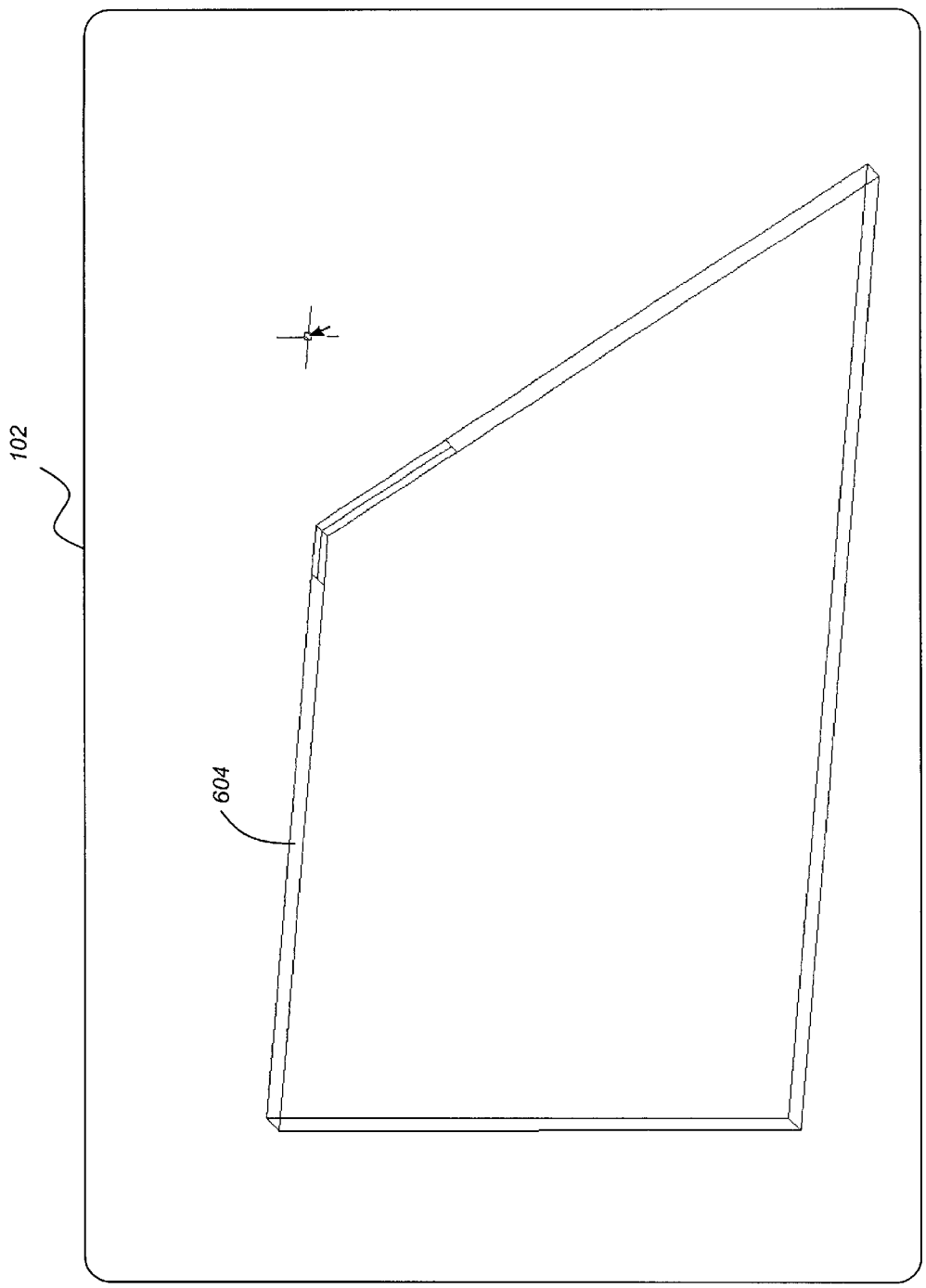
Figure 6C:
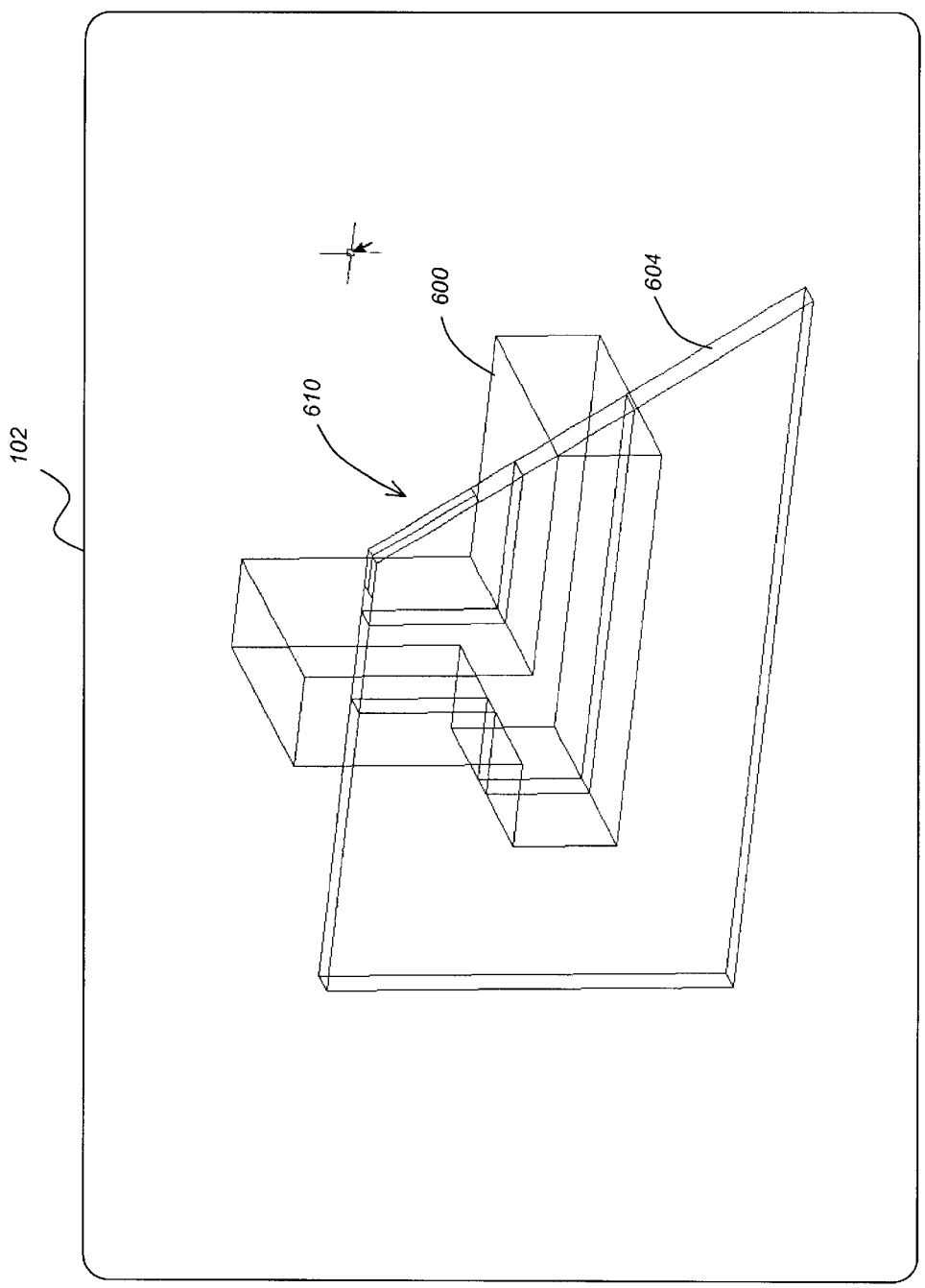
Figure 6D:
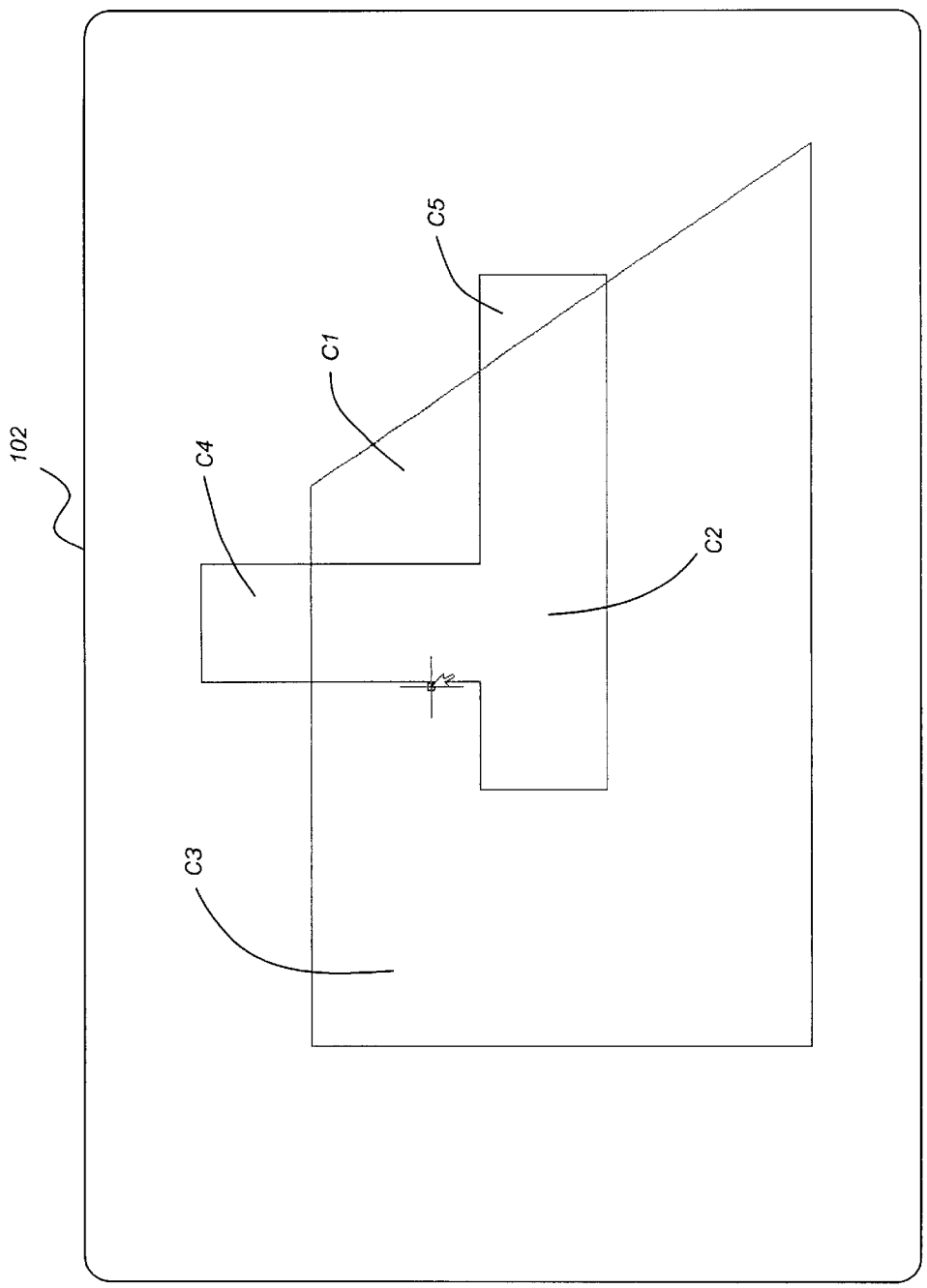

FIG. 6A shows an example of a part 600 and an open profile 602. The tool 604 created from the open profile 602 is shown in FIG. 6B. In FIG. 6A, rays 606 and 608 extend from the start and end segments of the open profile 602 in a tangential direction, so that the Geometric Modeler 204 can detect intersections with the part 600. Note that the horizontal ray 608 does not intersect the part 600, while the angled ray 606 does intersect the part 600. This information is recorded in the "ray_hit" attributes associated with the vertices connecting the start and end segments of the open profile 602. Also shown in FIG. 6B is the open profile 602 and the open sheet inserted into the tool 604. FIG. 6C shows the cellular topology graph structure 610 generated by the Feature-Based Modeler 206 from the part 600 and the tool 604. In FIG. 6D, the Feature-Based Modeler 206 performs cell selection using propagated attributes according to the preferred embodiment of the present invention. In this example, cells C1, C2, C3 are selected as the initial tool-type cells. However, only C1 and C2 are valid tool-type cells, since cell C3 has an edge with a "ray_hit" attribute having a value of 0. In order to generate the Rib feature, part-type cells C4 and C5 are also selected. Cells C1, C2, C4, and C5 together comprise the final result shown in FIG. 4B as the Rib feature.

Figure 7A:
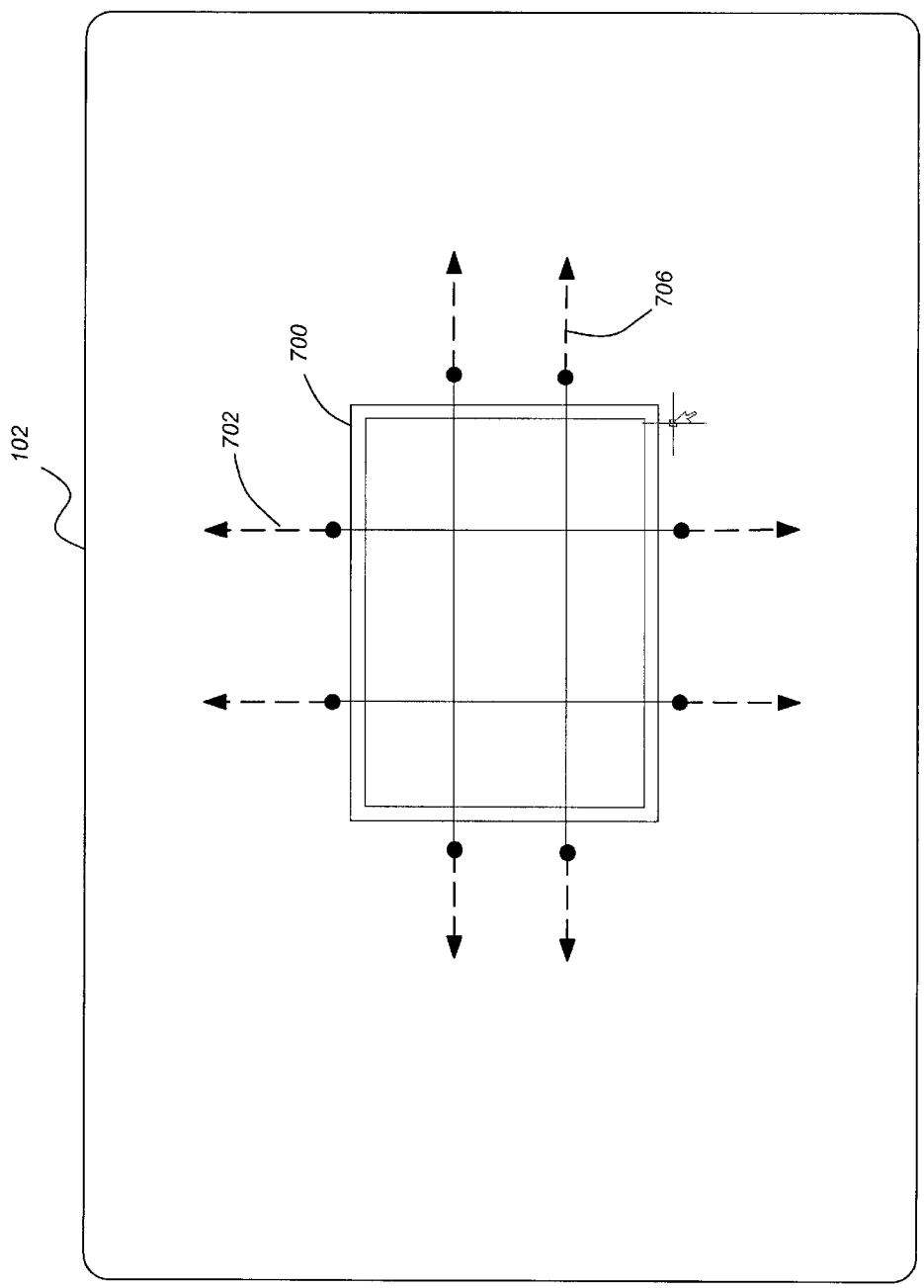
FIGS. 7A, 7B, 7C and 7D illustrate the generation of a Web feature from a cellular topology graph structure according to the preferred embodiment of the present invention.
Figure 7B:
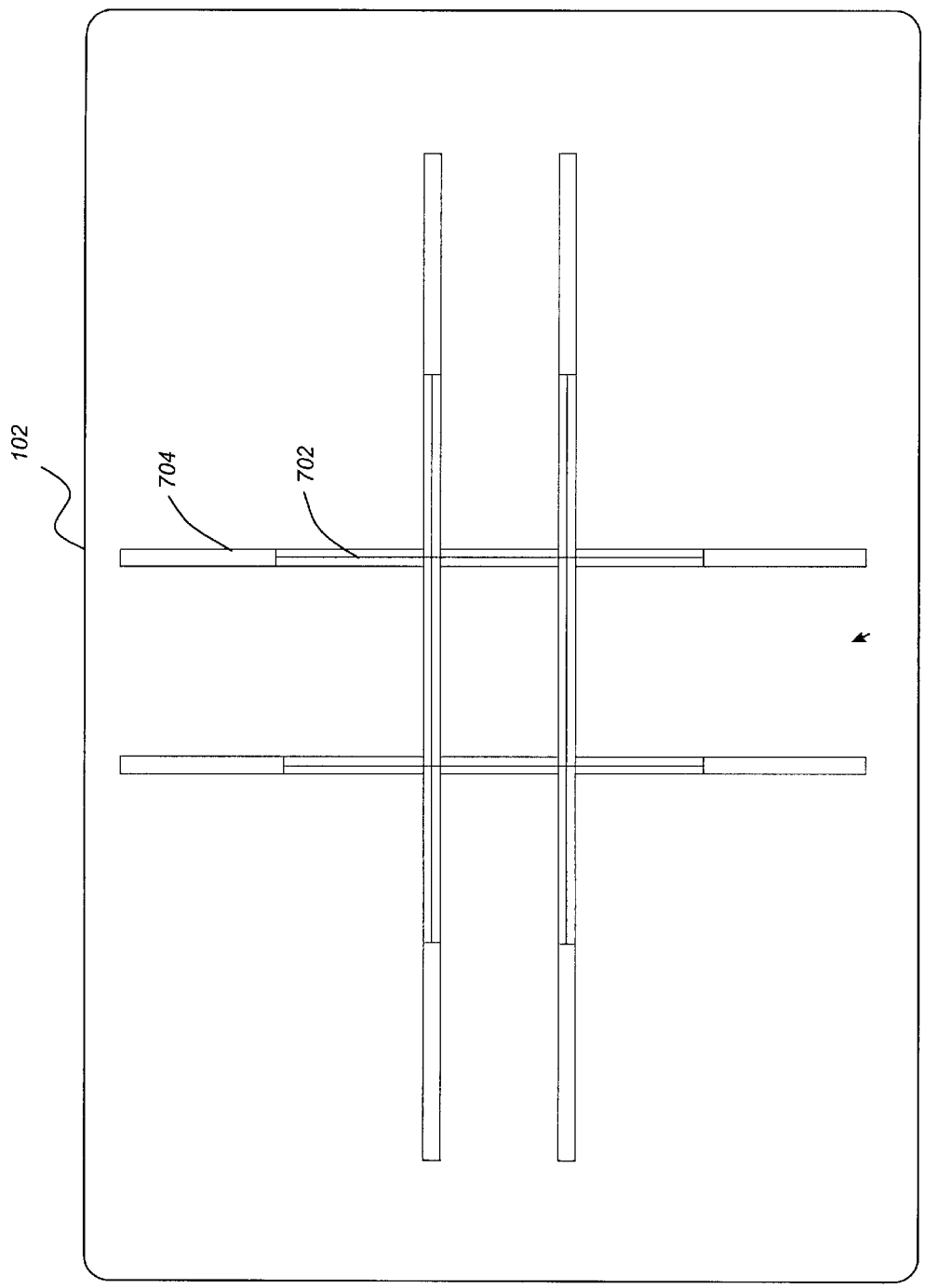
Figure 7C:
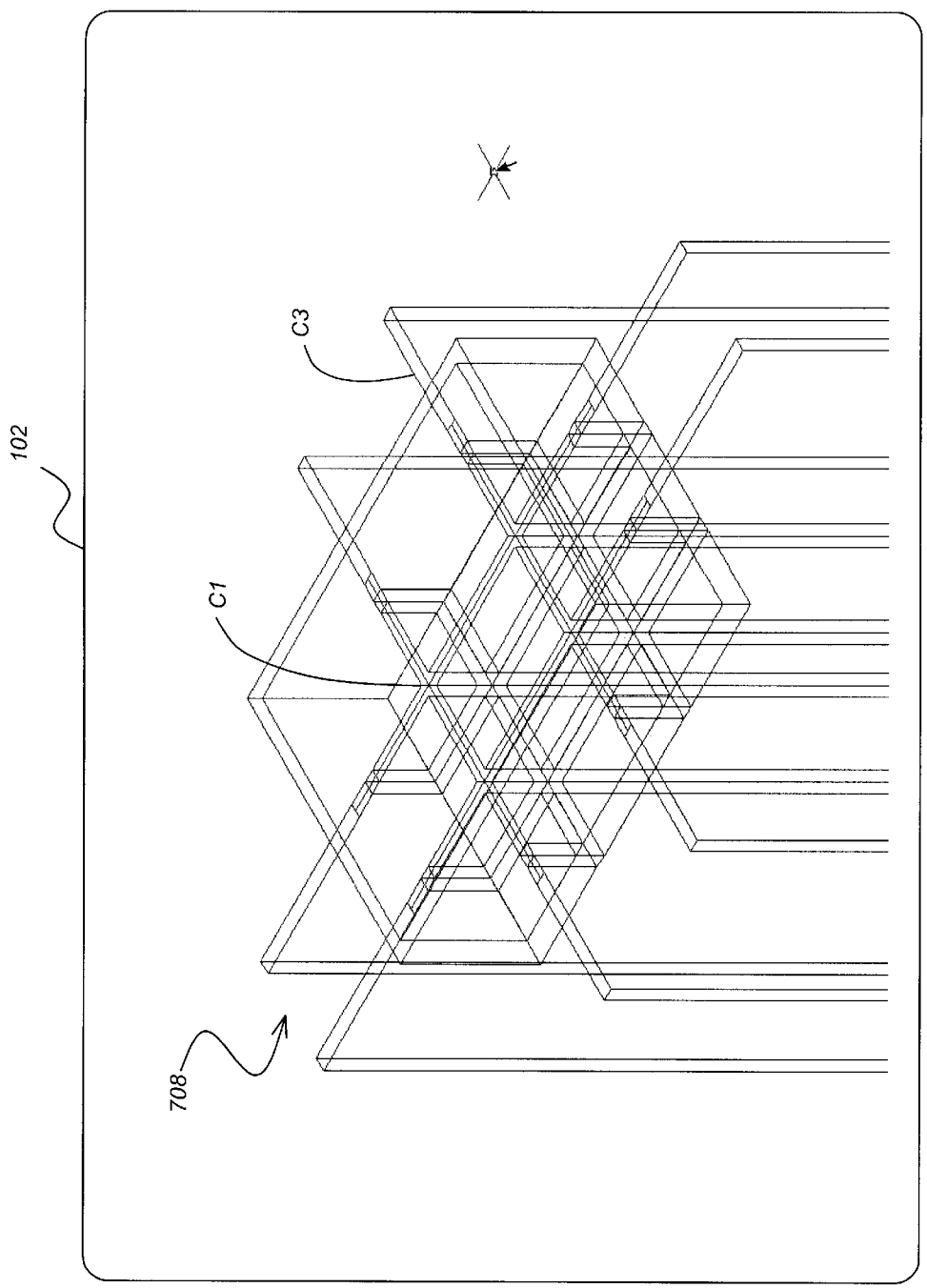
Figure 7D:
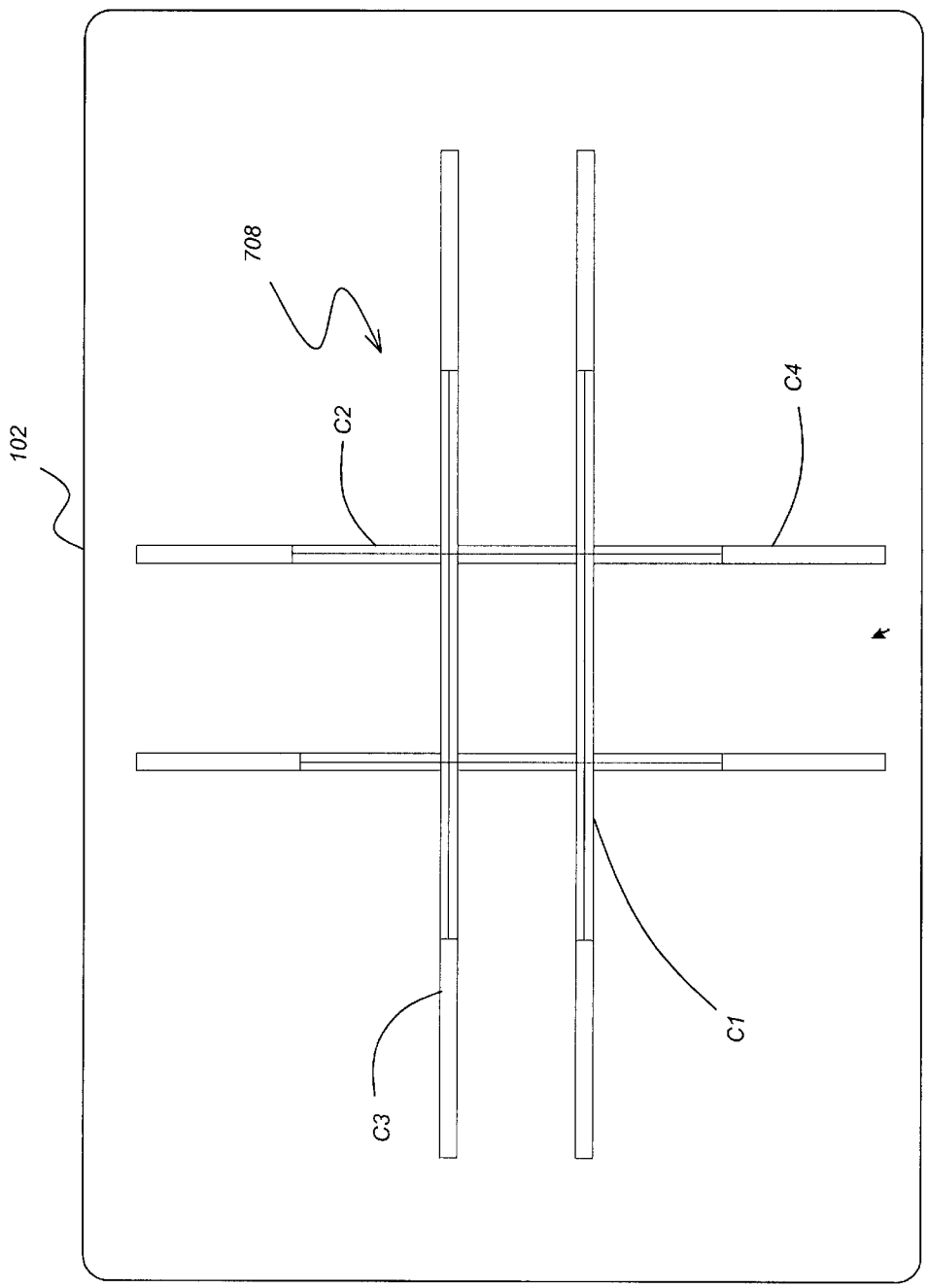

FIGS. 7A and 7B illustrate an example of Web feature, wherein FIG. 7A shows the part 700 and the open profile 702, and FIG. 7B shows the open profile 702 and the sheet inserted into the tool 704. Intersection analysis is performed at the ends of the open profile 702. Tangential rays 706 are shown as dashed arrows in FIG. 7A. In this case, none of the rays 706 intersect the part 700 and therefore all have "ray_hit" attributes with a value of 0. FIG. 7C illustrates an isometric view of the cellular topology graph structure 708 generated from the part 700 and tool 704, while FIG. 7D illustrates a two-dimensional top view of the cellular topology graph structure 708 generated from the part 700 and tool 704.

Figure 8:
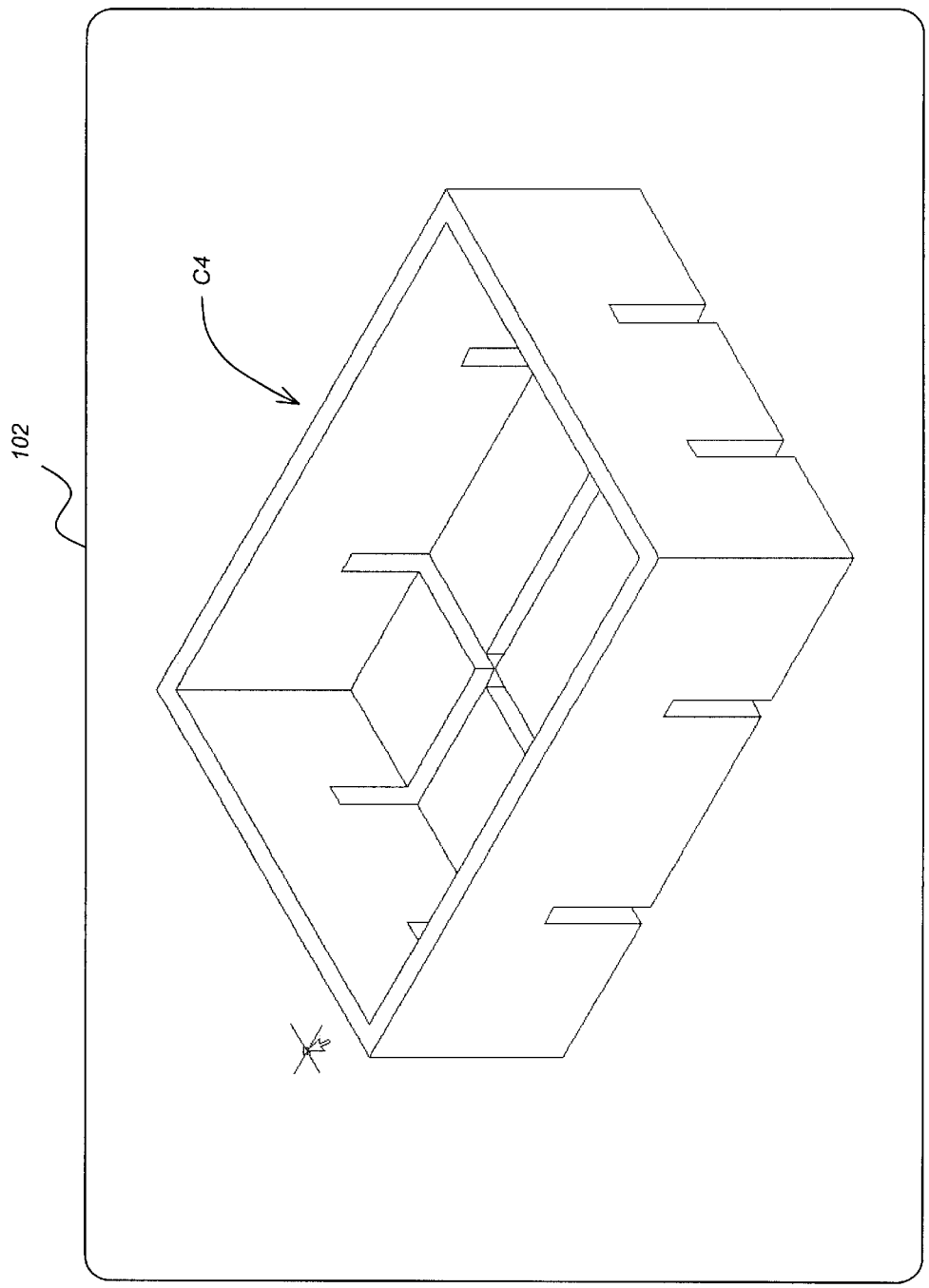
FIG. 8 illustrates a cut operation using a Web feature generated from a cellular topology graph structure according to the preferred embodiment of the present invention.
Figure 9:
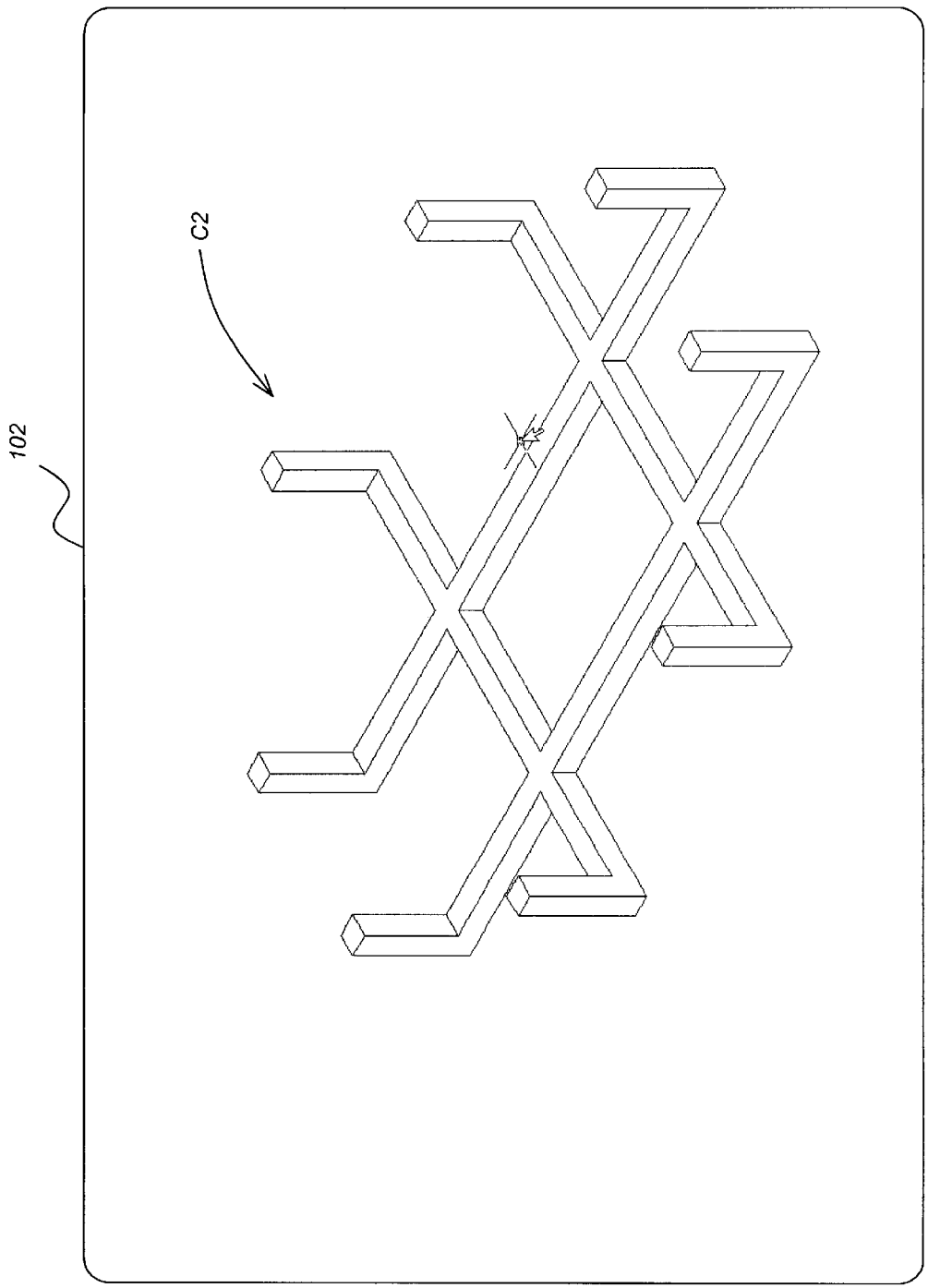
FIG. 9 illustrates an intersect operation using a Web feature generated from a cellular topology graph structure according to the preferred embodiment of the present invention.

FIG. 8 shows the result of a cut operation from FIGS. 7A–7D. For an intersect operation from FIGS. 7A–7D, only C2 is kept, which is shown in FIG. 9.

Referring again to FIGS. 7C–7D, cells C1, C2 (See FIG. 9 for C2), and C3 are the candidate tool-type cells. Among them, only C1 and C2 are valid cells. C3 is invalid because it has edges with "ray_hit" attributes having a value of 0. For a join operation, cells C1, C2, C4 (See FIG. 8 for C4) are retained. See FIG. 4B for the result shown as Web feature. For a cut operation, cell C4 is kept.

Logic of the Graphics Program

Figure 10A:
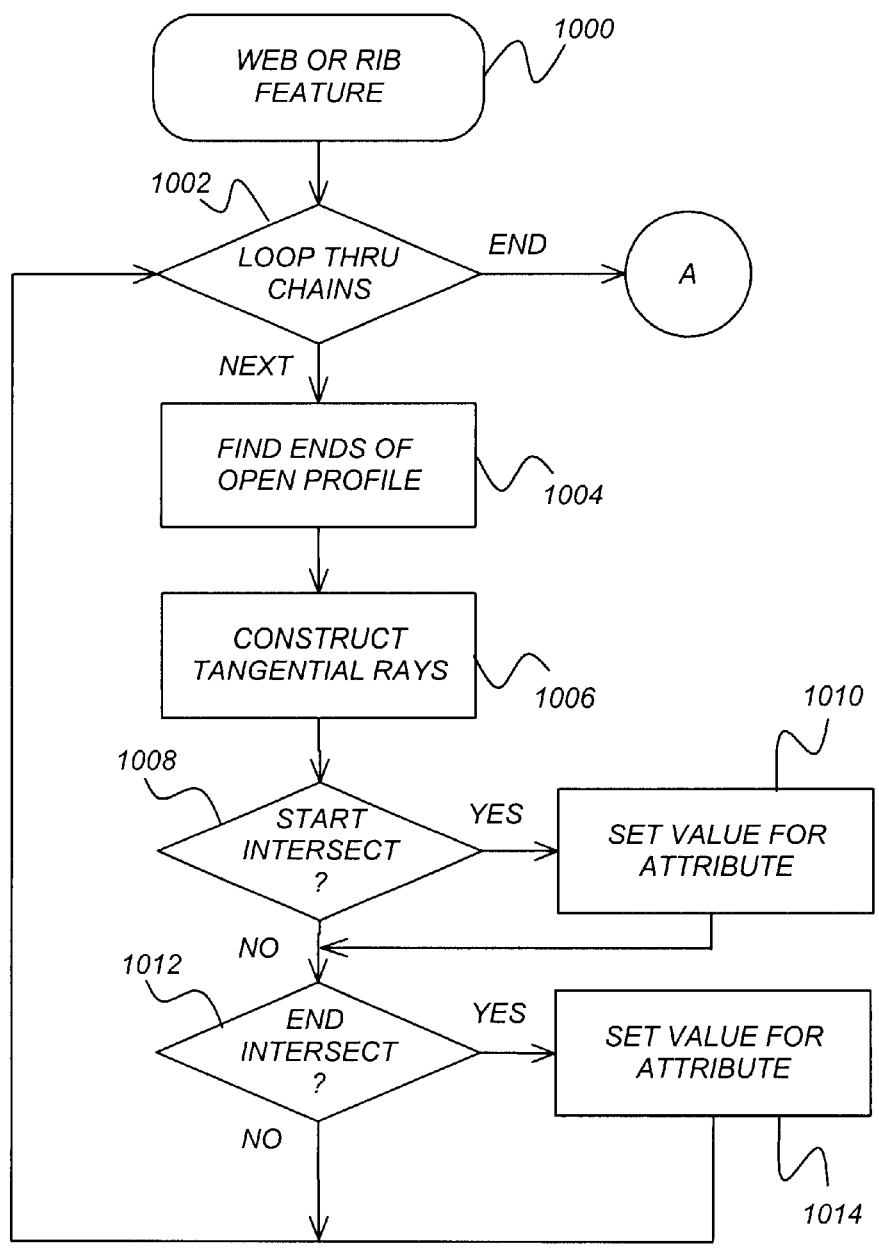
FIGS. 10A, 10B, and 10C together are a flowchart that illustrates the logic performed according to the preferred embodiment of the present invention.
Figure 10B:
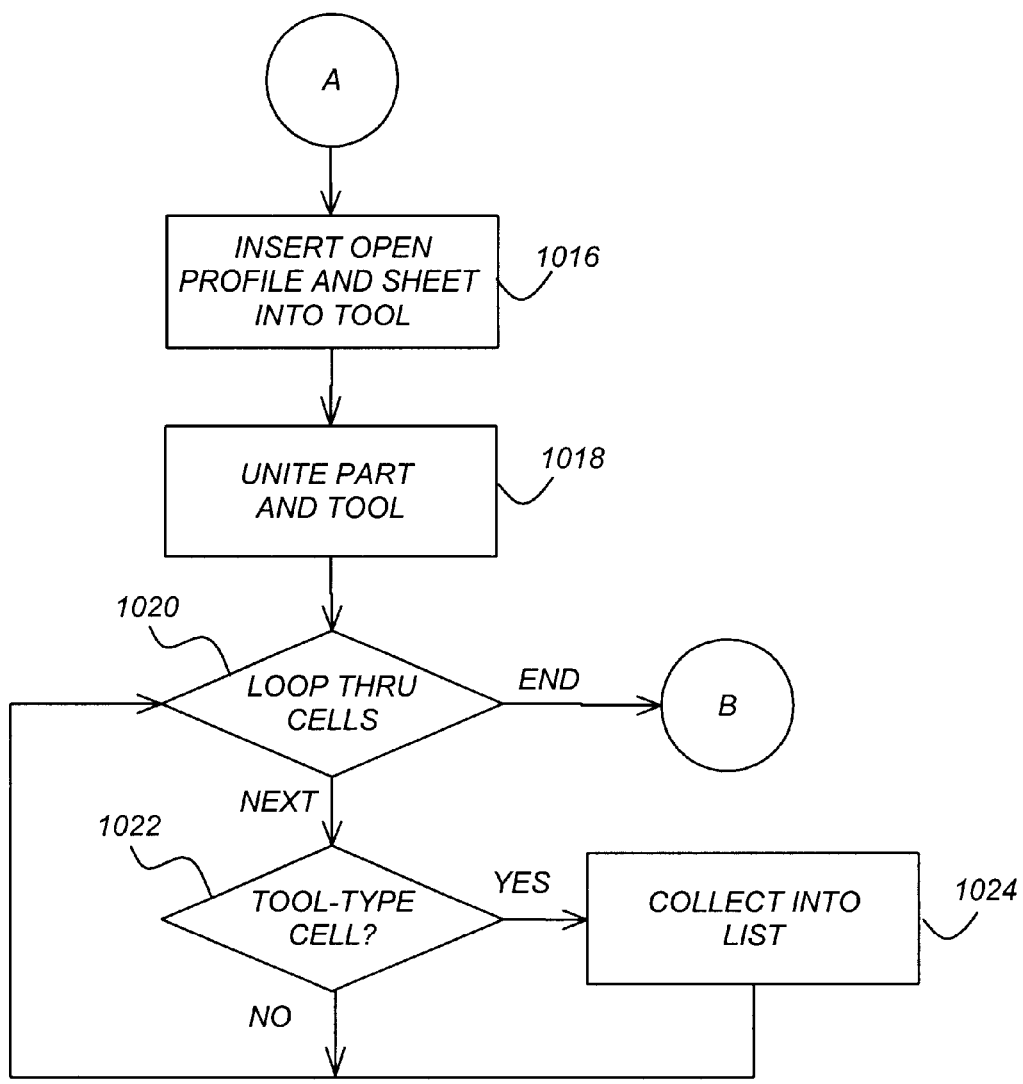
Figure 10C:
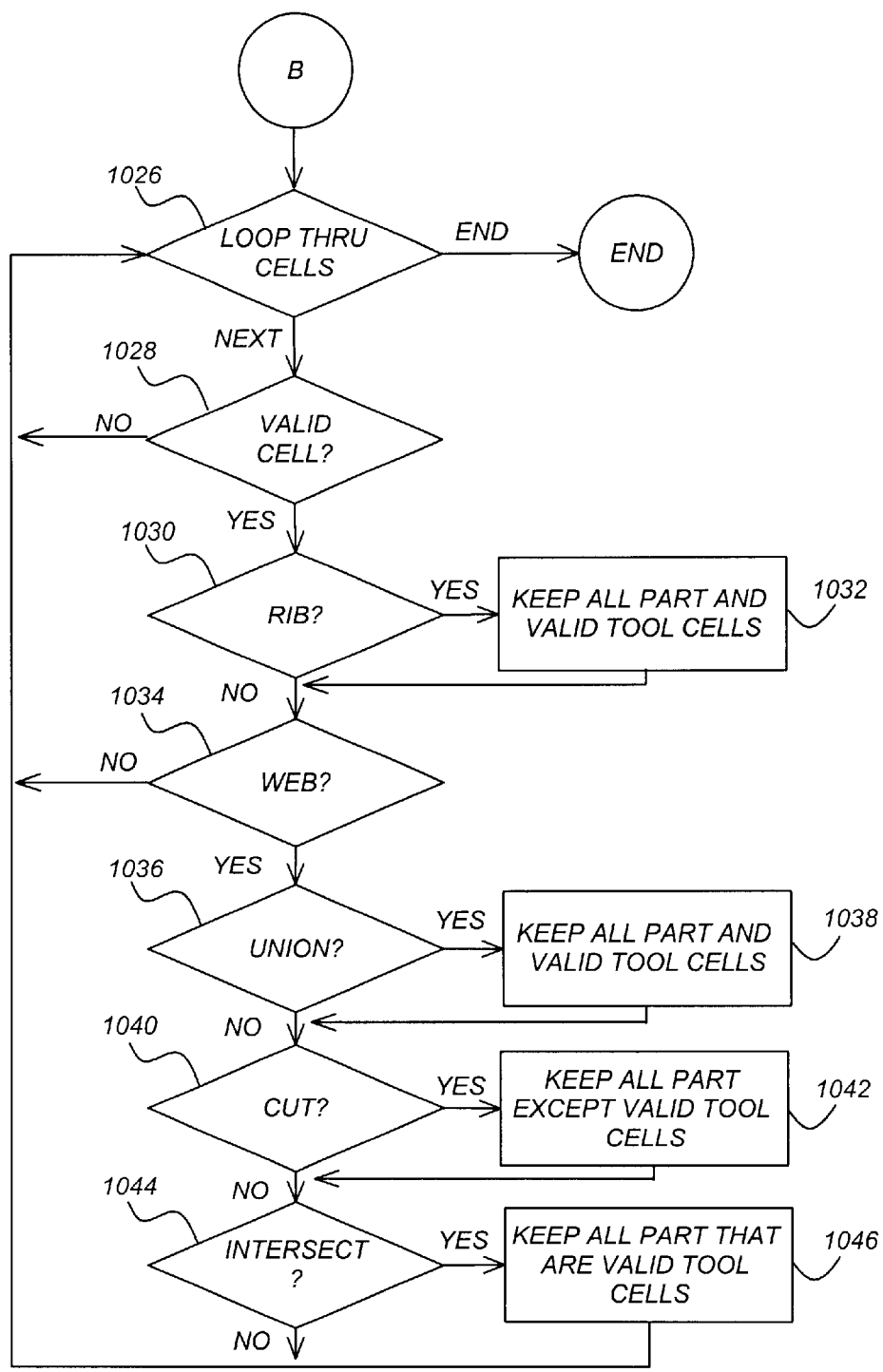

FIGS. 10A, 10B, and 10C together are a flowchart that illustrates the general logic performed according to the preferred embodiment of the present invention. Those skilled in the art will recognize that this logic is provided for illustrative purposes only and that different logic may be used to accomplish the same results.

Referring to FIG. 10A, Block 1000 represents the beginning of the logic, when a Rib or Web feature is requested.

Block 1002 is a decision block that represents the graphics program 106 looping through each chain of the open profile. For every iteration, control transfers to Block 1004; upon completion, control transfers to FIG. 10B via "A".

Block 1004 represents the graphics program 106 finding start and end segments for the chain of the open profile.

Block 1006 represents the graphics program 106 constructing rays tangential to the start and end segments. These rays are flipped if necessary, so that they always emanate in the extension direction.

Block 1008 is a decision block that represents the graphics program 106 determining whether the ray constructed at the start segment intersects the part. If so, control transfers to Block 1010; otherwise, control transfers to Block 1012.

Block 1010 represents the graphics program 106 setting the value of a "ray_hit" attribute associated with a vertex connecting the start segment and the constructed ray, wherein a value of 1 indicates that intersection did occur, while a value of 0 indicates otherwise.

Block 1012 is a decision block that represents the graphics program 106 determining whether the ray constructed at the end segment intersects the part. If so, control transfers to Block 1014; otherwise, control returns to Block 1002.

Referring to FIG. 10B, Block 1016 represents the graphics program 106 setting the value of a "ray_hit" attribute associated with a vertex connecting the end segment and the constructed ray, wherein a value of 1 indicates that intersection did occur, while a value of 0 indicates otherwise.

Block 1016 represents the graphics program 106 inserting the open profile and sheet, in a non-regularized manner, into the tool to provide a non-regularized tool body.

Block 1018 represents the graphics program 106 uniting the part and the tool with the inserted open profile, in a non-regularized manner, to generate a cellular topology graphical structure.

Block 1020 is a decision block that represents the graphics program 106 performing a first loop through all of the cells in the cellular topology graphical structure. For every iteration, control transfers to Block 1022; upon completion, control transfers to FIG. 10C via "C".

Block 1022 is a decision block that represents the graphics program 106 determining whether the cell is a tool-type cell. If so, control transfers to Block 1024; otherwise, control returns to Block 1020.

Block 1024 represents the graphics program 106 collecting the tool-type cells in a list.

Referring to FIG. 10C, Block 1026 is a decision block that represents the graphics program 106 performing a second loop through all of the cells in the cellular topology graphical structure. For every iteration, control transfers to Block 1028; upon completion, the logic terminates.

Block 1028 is a decision block that represents the graphics program 106 determining whether the cell is valid, wherein a cell is considered valid if one or more of its edges or faces have a "profile" attribute and the start and end segments of such edges either do not have a "ray_hit" attribute or have a "ray_hit" attribute with a value of 1. If so, control transfers to Block 1030; otherwise, control returns to Block 1026.

Block 1030 is a decision block that represents the graphics program 106 determining whether a Rib feature is being generated. If so, control transfers to Block 1032; otherwise, control transfers to Block 1034.

Block 1032 represents the graphics program 106 keeping all the part-type and valid tool-type cells and discarding the remaining cells, in order to create the Rib feature.

Block 1034 is a decision block that represents the graphics program 106 determining whether the Web feature is being generated. If so, control transfers to Block 1036; otherwise, control returns to Block 1026.

Block 1036 is a decision block that represents the graphics program 106 determining whether a union operation is being performed. If so, control transfers to Block 1038; otherwise, control transfers to Block 1040.

Block 1038 represents the graphics program 106 keeping all the part-type and valid tool-type cells and discarding the remaining the cells to generate the Web feature. Thereafter, control transfers to Block 1040.

Block 1040 is a decision block that represents the graphics program 106 determining whether a cut operation is being performed. If so, control transfers to Block 1042; otherwise, control transfers to Block 1044.

Block 1042 represents the graphics program 106 keeping all the part-type cells, except those that are also valid tool-type cells, and discarding the rest. Thereafter, control transfers to Block 1044.

Block 1044 is a decision block that represents the graphics program 106 determining whether an intersect operation is being performed. If so, control transfers to Block 1046; otherwise, control transfers to Block 1026.

Block 1046 represents the graphics program 106 keeping only those valid tool-type cells that are also part-type cells, and discarding the rest. Thereafter, control transfers to Block 1026.

Conclusion

This concludes the description of the preferred embodiment of the invention. The following describes some alternative embodiments for accomplishing the present invention. For example, any type of computer, such as a mainframe, minicomputer, work station or personal computer, could be used with the present invention. In addition, any program, function, or system providing functions for generating Rib or Web features in a solid modeling system could benefit from the present invention.

In summary, the present invention discloses a computer-implemented method, apparatus, and article of manufacture for generating Rib and Web features. One or more attribute values are set to indicate whether extended start and end segments for each chain of an open profile modeled in the system intersect with a part modeled in the system. The open profile and a corresponding sheet with attributes is inserted into the tool. The attribute behaviors are also specified. The tool generated from the open profile is united with the part to create a cellular topology graph structure, wherein the attribute values get propagated to one or more cells of the cellular topology graph structure. The Rib or Web feature is then generated from one or more cells selected from the cellular topology graph structure based on the propagated attribute values.

The foregoing description of the preferred embodiment of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto.

What is claimed is:

1. A method for generating a feature in a computer-implemented solid modeling system, comprising:

(a) setting one or more attribute values to indicate whether extended start and end segments for each chain of an open profile intersect with a part modeled in the system;

(b) inserting the open profile and sheet with attributes into a tool;

(c) uniting the tool with the inserted open profile and sheet with the part to create a cellular topology graph structure, wherein the attributes get propagated to the cellular topology graph structure; and (d) generating the feature from one or more cells selected from the cellular topology graph structure based on the propagated attributes.

2. The method of claim 1, wherein the feature is selected from a group comprising a rib feature and a web feature.

3. The method of claim 1, wherein the setting step further comprises:

constructing a ray tangential to the start segment;

determining whether the ray intersects with the part; and setting an attribute value associated with a vertex connecting the start segment and the ray based on whether the ray intersects with the part.

4. The method of claim 1, wherein the setting step further comprises:

constructing a ray tangential to the end segment;

determining whether the ray intersects with the part; and setting an attribute value associated with a vertex connecting the end segment and the ray based on whether the ray intersects with the part.

5. The method of claim 1, wherein the uniting step further comprises:

inserting the profile and the sheet with the attributes into the tool; and uniting the tool with the part in a non-regularized manner to create the cellular topology graph structure.

6. The method of claim 1, wherein the generating step further comprises:

identifying valid cells within the cellular topology graph structure based on the propagated attributes, and generating the feature from the valid cells.

7. The method of claim 1, wherein the open profile is created without the start and end segments aligned with the part.

8. The method of claim 1, wherein the profile is extruded in a perpendicular direction to the plane of the profile to create the tool.

9. The method of claim 1, wherein the tool and the part are united to create a rib feature.

10. The method of claim 1, wherein the tool and the part are unioned, subtracted or intersected to create a web feature.

11. The method of claim 1, wherein the solid modeling system decides what cells are retained to create the feature from a given set of part-type, tool-type and common type cells.

12. The method of claim 11, wherein a cell is one of the valid cells if one or more of its edges or faces includes at least a portion of the profile, and the vertices of the start and end segments do not include attributes or the start and end segments have attributes with set values.

13. The method of claim 11, wherein all the part-type cells and the valid tool-type cells are kept for a rib feature.

14. The method of claim 11, wherein the part-type cells are kept for a web feature based on an operation type.

15. The method of claim 14, wherein all the part-type cells and the valid tool-type cells are kept for a union operation.

16. The method of claim 14, wherein all the part-type cells except those that are the valid tool-type cells are kept for a cut operation.

17. The method of claim 14, wherein only the valid tool-type cells that are also part-type cells are kept for an intersect operation.

18. A computer-implemented graphics system, comprising:

(a) a computer; and (b) a feature-based modeler, executed by the computer, having logic for:

(1) setting one or more attribute values to indicate whether extended start and end segments for each chain of an open profile intersect with a part modeled in the system;

(2) inserting the open profile and sheet with attributes into the tool;

(3) uniting the tool with the inserted open profile and sheet with the part to create a cellular topology graph structure, wherein the attributes get propagated to the cellular topology graph structure; and (4) generating the feature from one or more cells selected from the cellular topology graph structure based on the propagated attributes.

19. The system of claim 18, wherein the feature is selected from a group comprising a rib feature and a web feature.

20. The system of claim 18, wherein the logic for setting further comprises logic for:

constructing a ray tangential to the start segment;

determining whether the ray intersects with the part; and setting an attribute value associated with a vertex connecting the start segment and the ray based on whether the ray intersects with the part.

21. The system of claim 18, wherein the logic for setting further comprises logic for:

constructing a ray tangential to the end segment;

determining whether the ray intersects with the part; and setting an attribute value associated with a vertex connecting the end segment and the ray based on whether the ray intersects with the part.

22. The system of claim 18, wherein the logic for uniting further comprises logic for:

inserting the profile and the sheet with the attributes into the tool; and uniting the tool with the part in a non-regularized manner to create the cellular topology graph structure.

23. The system of claim 18, wherein the logic for generating further comprises logic for:

identifying valid cells within the cellular topology graph structure based on the propagated attributes; and generating the feature from the valid cells.

24. The system of claim 18, wherein the profile is created without the start and end segments aligned with the part.

25. The system of claim 18, wherein the profile is extruded in a perpendicular direction to the plane of the profile to create the tool.

26. The system of claim 18, wherein the tool and the part are united to create a rib feature.

27. The system of claim 18, wherein the tool and the part are unioned, subtracted or intersected to create a web feature.

28. The system of claim 27, wherein the solid modeling system decides what cells are retained to create the feature from a given set of part-type, tool-type and common type cells.

29. The system of claim 28, wherein a cell is one of the valid cells if one or more of its edges or faces includes at least a portion of the profile, and the vertices of the start and end segments do not include attributes or the start and end segments have attributes with set values.

30. The system of claim 28, wherein all the part-type cells and the valid tool-type cells are kept for a rib feature.

31. The system of claim 28, wherein the part-type cells are kept for a web feature based on an operation type.

32. The system of claim 31, wherein all the part-type cells and the valid tool-type cells are kept for a union operation.

33. The system of claim 31, wherein all the part-type cells except those that are the valid tool-type cells are kept for a cut operation.

34. The system of claim 31, wherein only the valid tool-type cells that are also part-type cells are kept for an intersect operation.

35. An article of manufacture embodying logic for generating a feature in a computer-implemented solid modeling system, the logic comprising:

(a) setting one or more attribute values to indicate whether extended start and end segments for each chain of an open profile intersect with a part modeled in the system;

(b) inserting the open profile and sheet with attributes into the tool;

(c) uniting the tool with the inserted open profile and sheet with the part to create a cellular topology graph structure, wherein the attributes get propagated to the cellular topology graph structure; and (d) generating the feature from one or more cells selected from the cellular topology graph structure based on the propagated attributes.

36. The article of manufacture of claim 35, wherein the feature is selected from a group comprising a rib feature and a web feature.

37. The article of manufacture of claim 35, wherein the logic for setting further comprises logic for:

constructing a ray tangential to the start segment;

determining whether the ray intersects with the part; and setting an attribute value associated with a vertex connecting the start segment and the ray based on whether the ray intersects with the part.

38. The article of manufacture of claim 35, wherein the logic for setting further comprises logic for constructing a ray tangential to the end segment;

determining whether the ray intersects with the part; and setting an attribute value associated with a vertex connecting the end segment and the ray based on whether the ray intersects with the part.

39. The article of manufacture of claim 35, wherein the logic for uniting further comprises logic for:

inserting the profile and the sheet with the attributes into the tool; and uniting the tool with the part in a non-regularized manner to create the cellular topology graph structure.

40. The article of manufacture of claim 35, wherein the logic for generating further comprises logic for:

identifying valid cells within the cellular topology graph structure based on the propagated attributes; and generating the feature from the valid cells.

41. The article of manufacture of claim 35, wherein the profile is created without the start and end segments aligned with the part.

42. The article of manufacture of claim 35, wherein the profile is extruded in a perpendicular direction to the plane of the closed profile to create the tool.

43. The article of manufacture of claim 35, wherein the tool and the part are united to create a rib feature.

44. The article of manufacture of claim 35, wherein the tool and the part are unioned, subtracted or intersected to create a web feature.

45. The article of manufacture of claim 35, wherein the solid modeling system decides what cells are retained to create the feature from a given set of part-type, tool-type and common type cells.

46. The article of manufacture of claim 45, wherein a cell is one of the valid cells if one or more of its edges or faces includes at least a portion of the profile, and the vertices of the start and end segments do not include attributes or the start and end segments have attributes with set values.

47. The article of manufacture of claim 45, wherein all the part-type cells and the valid tool-type cells are kept for a rib feature.

48. The article of manufacture of claim 45, wherein the part-type cells are kept for a web feature based on an operation type.

49. The article of manufacture of claim 48, wherein all the part-type cells and the valid tool-type cells are kept for a union operation.

50. The article of manufacture of claim 48, wherein all the part-type cells except those that are the valid tool-type cells are kept for a cut operation.

51. The article of manufacture of claim 48, wherein only the valid tool-type cells that are also part-type cells are kept for an intersect operation.

* * * * *

UNITED STATES PATENT AND TRADEMARK OFFICE
CERTIFICATE OF CORRECTION

PATENT NO. : 6,654,654 B1
DATED : November 25, 2003
INVENTOR(S) : Somashekar Ramachandran Subrahmanyam and Mahabaduge Janaka Kithsiri Jayasuriya It is certified that error appears in the above-identified patent and that said Letters Patent is hereby corrected as shown below:

Column 9,
Line 40, before "plane", "the" (first occurrence) should read -- a --.
Line 51, after "is", delete "one of the" and insert -- a --.
Line 52, after "valid", "cells" should read -- cell --.
Line 53, before "vertices", delete "the" (second occurrence).
Lines 57 and 61, after "and" delete "the".
Line 63, after "are" delete "the".
Line 65, after "only" delete "the" (second occurrence).

Column 10,
Line 11, after "into" delete "the".
Line 48, after "to" delete "the" and insert -- a --.
Line 55, after "the" (second occurrence) delete "solid modeling".
Line 59, after "is" delete "one of the" and insert -- a --.
Line 61, after "and" (first occurrence) delete "the".
Line 65, after "and" delete "the".

Column 11,
Line 2, after "and" delete "the".
Line 4, after "are" delete "the".
Line 6, after "only" delete "the".

UNITED STATES PATENT AND TRADEMARK OFFICE
CERTIFICATE OF CORRECTION

PATENT NO.   : 6,654,654 B1
DATED        : November 25, 2003
INVENTOR(S)  : Somashekar Ramachandran Subrahmanyam and Mahabaduge Janaka Kithsiri Jayasuriya It is certified that error appears in the above-identified patent and that said Letters Patent is hereby corrected as shown below:

<u>Column 12,</u>
Line 14, after "to", "the" should read -- a --.
Line 25, "one of the" should read -- a --, and "cells" should read -- cell --.
Lines 26, 30 and 36, after "and" delete "the".
Line 39, after "are" delete "the".
Line 42, before "valid" delete "the".

Signed and Sealed this

Twenty-seventh Day of April, 2004

JON W. DUDAS
*Acting Director of the United States Patent and Trademark Office*